US005926054A

United States Patent [19]

Friedrich et al.

[11] Patent Number: 5,926,054

[45] Date of Patent: Jul. 20, 1999

[54] MODIFICATION OF PROCESS CONTROL SIGNALS SO AS TO ENABLE REPRODUCTION APPARATUS TO OPERATE OVER AN ALTERNATE PROCESS RANGE

[75] Inventors: Kenneth P. Friedrich, Honeoye; Allan M. Kaplan, Rochester; Lamont R. Wright, Fairport, all of N.Y.

[73] Assignee: Eastman Kodak Company, Rochester, N.Y.

[21] Appl. No.: 08/901,183

[22] Filed: Jul. 28, 1997

[51] Int. Cl.$^{6}$ .................. H03L 5/00

[52] U.S. Cl. .................. 327/307; 330/9; 330/129; 330/151; 399/11; 327/331

[58] Field of Search .................. 327/307, 362, 327/331, 333, 334, 560, 561, 563, 403, 407; 330/9, 129, 151; 399/11

[56] References Cited

U.S. PATENT DOCUMENTS

| | | | |
|---|---|---|---|
| 3,641,444 | 2/1972 | Watts | 327/307 |
| 4,086,541 | 4/1978 | Katou et al. | 330/51 |
| 4,147,989 | 4/1979 | Brolde | 327/363 |
| 5,264,804 | 11/1993 | Fox | 327/558 |
| 5,272,449 | 12/1993 | Izawa | 330/2 |
| 5,365,189 | 11/1994 | Coulson | 330/126 |
| 5,404,315 | 4/1995 | Nakano et al. | 364/514 |
| 5,578,949 | 11/1996 | McMorrow, Jr. | 327/103 |
| 5,661,423 | 8/1997 | Mizuhara | 327/74 |
| 5,796,291 | 8/1998 | Mattes et al. | 327/513 |

*Primary Examiner*—Kenneth B. Wells
*Assistant Examiner*—Hai L. Nguyen
*Attorney, Agent, or Firm*—Lawrence P. Kessler

[57] ABSTRACT

Modification of process control signals so as to enable electrostatographic reproduction apparatus, including a dielectric support member transported about a path into operative association with electrographic process elements to form an information reproduction on a receiver member and a process controller for receiving and sending appropriate timing control signals in an expected value range for controlling the electrographic process, to operate over an alternate process range. For the desired signal modification, an input signal in a particular value range is received. A predetermined gain is applied to the received signal, and thereafter a predetermined offset is applied to the signal as modified by the gain application. The signal derived by gain application and offset is then emitted at an alternate value range to effect process control.

6 Claims, 2 Drawing Sheets

MODIFICATION OF PROCESS CONTROL SIGNALS SO AS TO ENABLE REPRODUCTION APPARATUS TO OPERATE OVER AN ALTERNATE PROCESS RANGE

BACKGROUND OF THE INVENTION

The present invention relates in general to process control for reproduction apparatus, and more particularly to modification of process control signals so as to enable reproduction apparatus to operate over an alternate process range.

In typical commercial electrostatographic reproduction apparatus (copier/duplicators, printers, or the like), a latent image charge pattern is formed on a uniformly charged charge-retentive or photo-conductive member having dielectric characteristics (hereinafter referred to as the dielectric support member). Pigmented marking particles are attracted to the latent image charge pattern to develop such image on the dielectric support member. A receiver member, such as a sheet of paper, transparency or other medium, is then brought into contact with the dielectric support member, and an electric field applied to transfer the marking particle developed image to the receiver member from the dielectric support member. After transfer, the receiver member bearing the transferred image is transported away from the dielectric support member, and the image is fixed (fused) to the receiver member by heat and pressure to form a permanent reproduction thereon.

For control of the electrostatographic reproduction apparatus process, appropriate sensors are provided to detect the position of the dielectric support member in relation to the image forming processing stations, and the location of a receiver member in its travel path, and produce appropriate signals indicative thereof. Such signals are fed as input information to a process controller having a logic and control unit including a microprocessor, for example. Based on such signals and a suitable program for the microprocessor, the logic and control unit produces signals to control the timing operation of the various electrographic process stations for carrying out the reproduction process. The production of a program for a number of commercially available microprocessors is a conventional skill well understood in the art. The particular details of any such program would, of course, depend on the architecture of the designated microprocessor. The process control for the reproduction apparatus is limited by the particular value range of signals provided by the sensors for the process controller logic and control unit or sent to the process elements by the logic and control unit. If elements outside the normally provided process elements are substituted as replacement parts, the signal to or from such replacement parts may fall outside the particular value range for the reproduction apparatus, and will most likely cause the reproduction apparatus to fail to function properly.

SUMMARY OF THE INVENTION

In view of the foregoing discussion, this invention is directed to modification of process control signals so as to enable electrostatographic reproduction apparatus, including a dielectric support member transported about a path into operative association with electrographic process elements to form an information reproduction on a receiver member and a process controller for receiving and sending appropriate timing control signals in an expected value range for controlling the electrographic process, to operate over an alternate process range. For the desired signal modification, an input signal in a particular value range is received. A predetermined gain is applied to the received signal, and thereafter a predetermined offset is applied to the signal as modified by the gain application. The signal derived by gain application and offset is then emitted at an alternate value range to effect process control.

The invention, and its objects and advantages, will become more apparent in the detailed description of the preferred embodiment presented below.

BRIEF DESCRIPTION OF THE DRAWINGS

In the detailed description of the preferred embodiment of the invention presented below, reference is made to the accompanying drawings, in which.

DETAILED DESCRIPTION OF THE INVENTION

Figure 1:
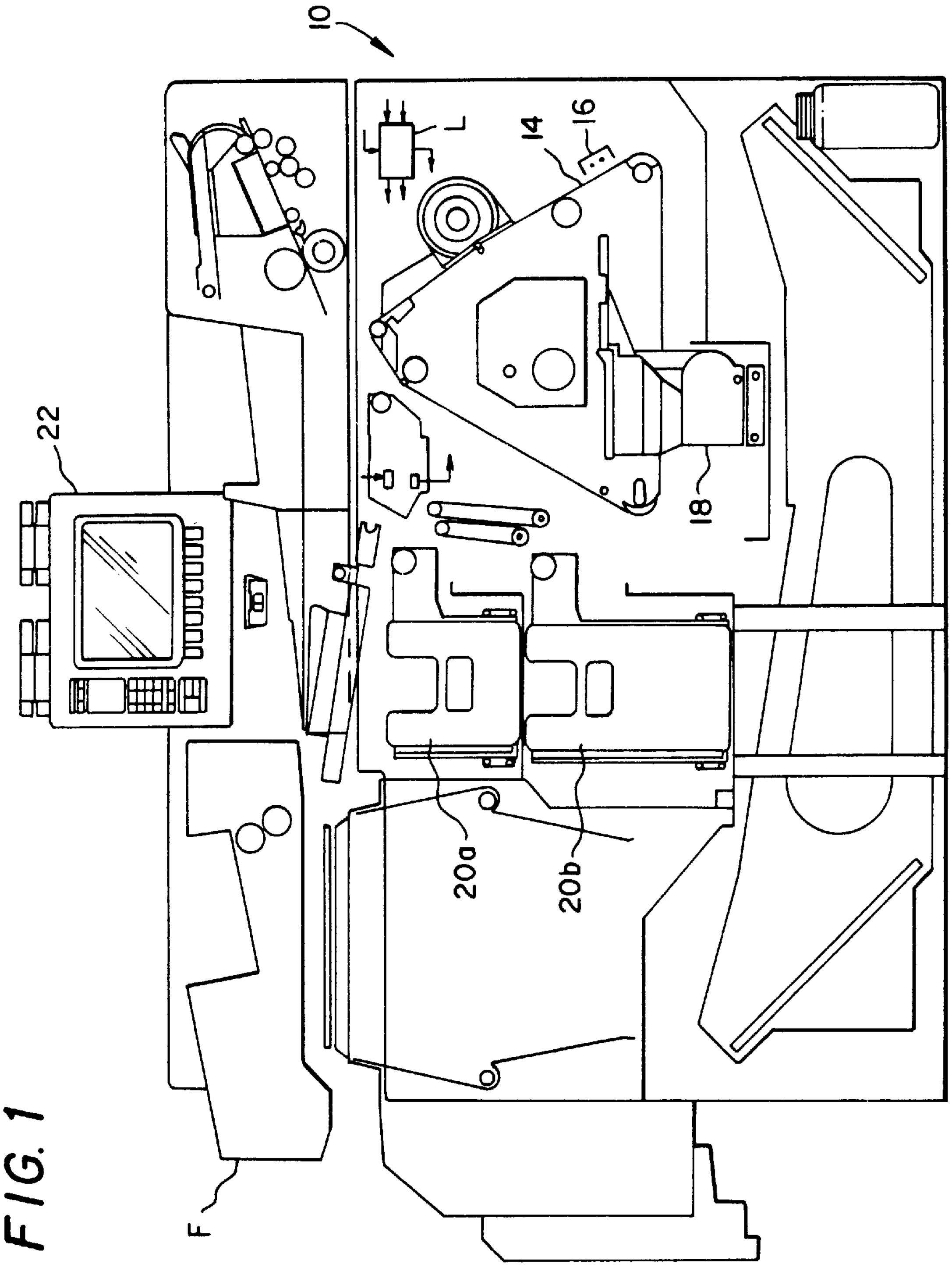
FIG. 1 is a schematic illustration of an exemplary electrostatographic reproduction apparatus.

Referring now to the accompanying drawings, FIG. 1 shows an exemplary electrostatographic reproduction apparatus, designated by the numeral 10 including a charge-retentive or photo-conductive member having dielectric characteristics (hereinafter referred to as the dielectric support member 14). In operation, the dielectric support member 14 is transported about a closed loop path where it is brought into operative association with electrographic process stations or elements. The dielectric support member 14 is first uniformly charged by any suitable charger device 16. A latent image charge pattern corresponding to information to be reproduced is formed on the dielectric support member by exposure of the uniformly charged portion of the dielectric support member to a light image corresponding to information to be reproduced. The information to be reproduced may be presented as a reflected light image of information contained in documents circulated for copying by the feeder F, or may be electrically produced by turning on (and off) a light emitting device such as a laser or light emitting diode (LED) array (not shown). Thereafter, pigmented marking particles from a development station 18 are attracted to the latent image charge pattern on the dielectric support member 14 to develop such latent image. A receiver sheet fed at an appropriate time from a supply tray (20*a* or 20*b*) is then brought into contact with the dielectric support member 14, and an electric field is applied to transfer the marking particle developed image to the receiver sheet from the dielectric support member. After transfer, the receiver sheet bearing the transferred image is transported away from the dielectric member 14, and the image is fused to the receiver sheet by heat and pressure to form a permanent reproduction thereon.

In order to control the reproduction apparatus 10, the reproduction apparatus incorporates a process controller including a logic and control unit L which receives input signals, at an expected value range, from an operator communication interface 22 and a plurality of appropriate sensors (not shown) associated in any well known manner with the electrographic stations and elements of the reproduction apparatus 10 and the receiver member travel path. Based on such signals and a program for the microprocessor, the logic and control unit L produces appropriate signals at a particular value range to control the various operating devices and stations within the reproduction apparatus. The production of a program for a number of commercially available microprocessors is a conventional skill well understood in the art, and do not form a part of this invention. The particular details of any such program would, of course, depend upon the architecture of the designated microprocessor.

Periodically, consumables such as the dielectric support member or pigmented marking particles, for example, must be replaced. Additionally, at various times, process elements such as chargers or transfer devices, for example, must also be replaced. In the past, when making any such replacement, a substantially identical replacement part had to be used to assure that the process controller would continue to receive appropriate timing control signals in the expected value range from the replacement part, and the replacement part would receive appropriate timing control signals in the particular value range sent from the process controller, in order to function in a manner whereby the process controller will properly control the electrographic process. It is, however, desirable to be able to provide replacement parts (consumables and process elements) from an extended range of parts; i.e., parts from different manufacturing sources or with different operational characteristics. This will, for example, enable a particular replacement part to be stocked for a variety of different reproduction apparatus from a single manufacturing source, or a particular replacement part from one manufacturing source to be stocked for use with reproduction apparatus from a multiplicity of manufacturing sources.

Figure 2:
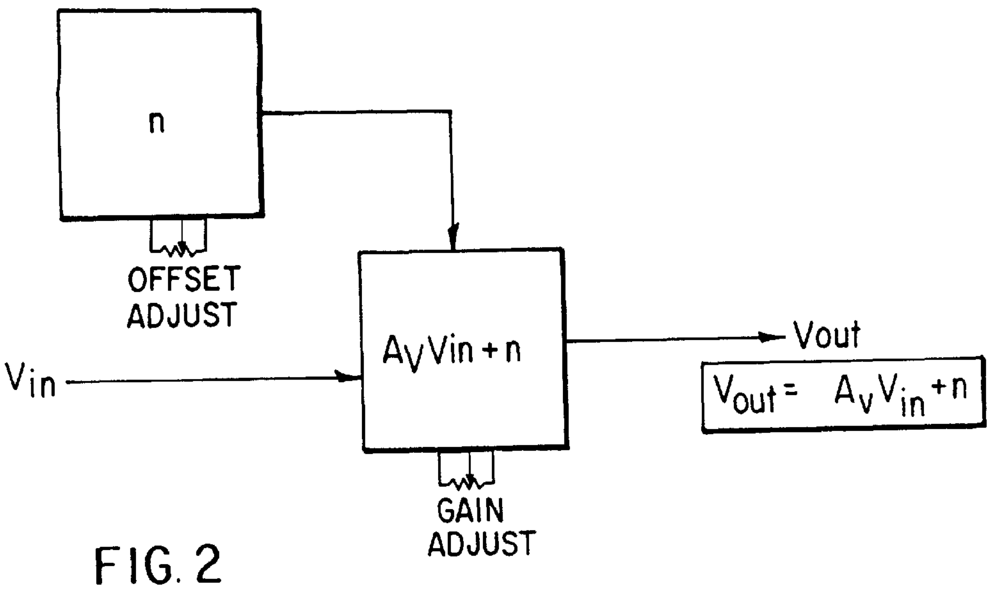
FIG. 2 is a schematic block diagram representing process control signal modification according to this invention, where process control signals are modified to enable the exemplary electrostatographic reproduction apparatus to operate over an alternate process range.

According to this invention, in order to accomplish the provision of replacement parts from an extended range of parts, one must be able to modify process control signals so as to enable reproduction apparatus to operate over an alternate process range. That is, the process control signals must be modified such that the process control unit receives input signals in an expected value range or generates control signals which are modified to be in a particular value range when received at the process element to be controlled. Accordingly, a device is provided which, as shown in FIG. 2, takes an input signal $V_{in}$ and modifies such signal by applying an adjustable predetermined gain $A_v$ and/or offset n to produce a desired altered output signal $V_{out}$ for emission according to the equation $$V_{out}=A_v V_{in}+n.$$

Figure 3:
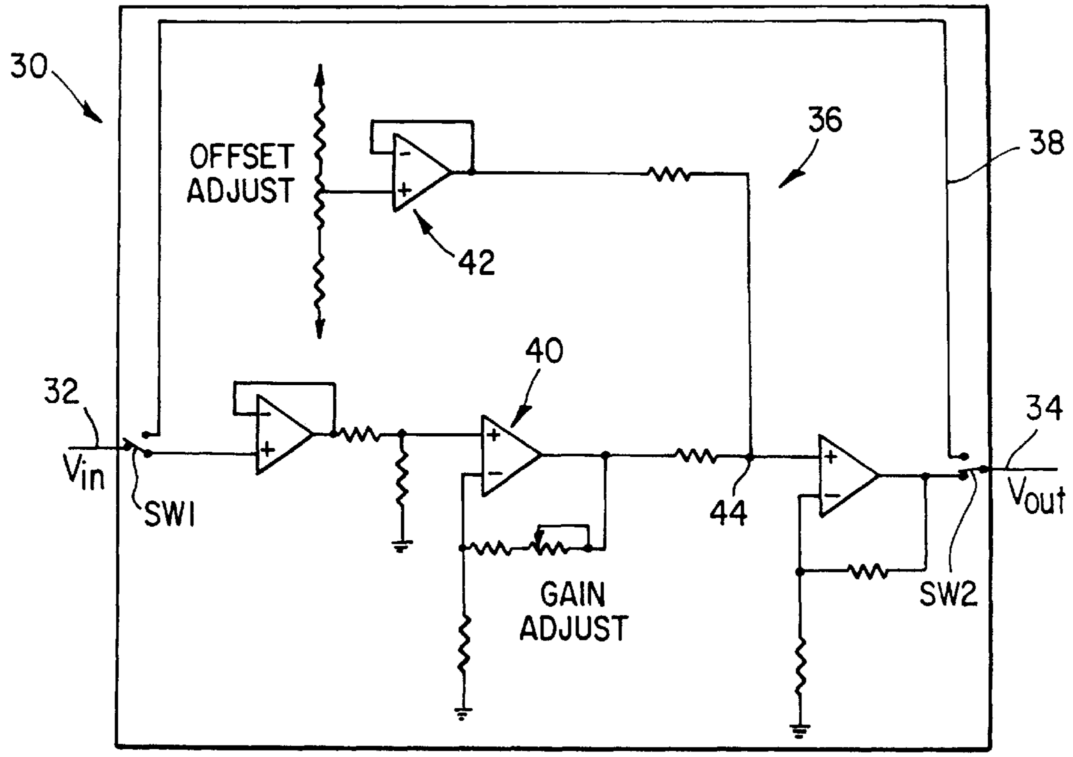
FIG. 3 is a schematic electrical diagram of a process control signal modification device according to this invention.

FIG. 3 shows a schematic electrical diagram of a process control signal modification device, according to this invention, designated generally by the numeral 30. The process control signal modification device 30 includes a first switch SW1 connected to a first lead 32 for an input signal $V_{in}$ and a second switch SW2 connected to a second lead 34 for an output signal $V_{out}$. One tap of each of the switches SW1 and SW2 is connected to a signal modification circuit 36, while the other tap of each of the switches is connected to a bypass lead 38. When the switches are respectively connected to the bypass lead 38, the value of the emitted output signal $V_{out}$ will equal the value of the received input signal $V_{in}$.

The signal modification circuit 36 includes an adjustable gain operational amplifier 40 and an adjustable offset operational amplifier 42. The output of the adjustable offset operational amplifier 42 is connected at a node 44 to the output of the adjustable gain operational amplifier 40 so as to sum the respective outputs. In this manner, when the switches SW1 and SW2 are connected to the signal modification circuit 36, the input signal $V_{in}$, is modified by applying an adjustable predetermined gain $A_v$ and/or offset n to produce the desired altered output signal $V_{out}$.

The adjustable gain operational amplifier 40 and adjustable offset operational amplifier 42 are set to predetermined values based on the alteration of the input signal $V_{in}$ so that it will reach a desired output signal $V_{out}$. Of course, such alteration is dependent upon the source of the input signal and the destination of the output signal. As an illustrative example, in the electrostatographic reproduction apparatus 10, it may be desired to utilize a replacement dielectric support member available from a different manufacturing source than that as originally supplied, and such replacement dielectric support member may function at different operating parameters than the original dielectric support member. That is, for example, the control voltage to the charger grid power supply may have to be altered so that the dielectric support member is charged to a different voltage during the uniform charging step in the electrographic process. It is therefore necessary to alter the value range of the signals from the dielectric support member to the logic and control unit L and from the logic and control unit to the dielectric support member such that the logic and control unit believes it is functioning with a dielectric support member of the original type. Since the value range of the original signals is known, the required gain and offset (may in fact be zero) of the new signals may be readily determined, and the adjustable gain operational amplifier 40 and adjustable offset operational amplifier 42 set accordingly.

Thereafter, when the switches SW1 and SW2 are connected to the modification circuit 36 of the process control signal modification device 30, the applied signal will be appropriately modified to a desired predetermined altered value range so as to appear to be in the expected value range when emitted from the signal modification device. Thus the reproduction apparatus will continue to function properly and reproduce the desired information to be copied. While any appropriate signal generated in the operation of the electrostatographic reproduction apparatus may be modified function at an altered value range by the process control signal modification device 30 according to this invention, some additional illustrative examples of electrostatographic reproduction apparatus signals which may need to be modified with the use of alternate replacement parts include modifying an on board densitometer signal to accommodate for use of a different colored marking particle set, or modifying voltage from an alternate high voltage power supply.

The invention has been described in detail with particular reference to certain preferred embodiments thereof, but it will be understood that variations and modifications can be effected within the spirit and scope of the invention.

What is claimed is:

1. An electrostatographic reproduction apparatus including a dielectric support member transported about a path into operative association with electrographic process elements to form an information reproduction on a receiver member and a process controller for receiving and sending appropriate timing control signals in an expected value range for controlling said electrographic process elements, a signal modification device for modifying process control element signals, said signal modification device comprising:

a first signal lead for an input signal, associated with electrographic process element control for said dielectric support member, in a particular value range;

a signal modification circuit connected to said first lead, said signal modification circuit including a first signal modifier which applies a predetermined gain to an input signal from said first lead, and a second signal modifier which applies a predetermined offset to said signal as modified by said first signal modifier; and a second signal lead, connecting said signal modification circuit to said reproduction apparatus process controller for emitting an output signal as modified by said first and second signal modifiers, at an alternate value range to enable said reproduction apparatus to operate over an alternate process range.

2. The signal modification device according to claim 1 wherein said first signal modifier is an operational amplifier.

3. The signal modification device according to claim 1 wherein said second signal modifier is an operational amplifier.

4. The signal modification device according to claim 1 wherein said first and second signal modifiers are operational amplifiers.

5. The signal modification device according to claim 4 wherein said second operational amplifier has an output connected at a node to the output of said first operational amplifier to sum the respective outputs of said first and second operational amplifiers.

6. The signal modification device according to claim 1 wherein said signal modification circuit further includes a bypass lead, and a first switch to selectively connect said first signal lead to said first signal modifier as an input thereto and said bypass lead, and a second switch to selectively connect said second signal lead to said first signal modifier downstream of said node and said bypass lead.

* * * * *